United States Patent
Hoffman et al.

(10) Patent No.: US 7,265,003 B2
(45) Date of Patent: Sep. 4, 2007

(54) METHOD OF FORMING A TRANSISTOR HAVING A DUAL LAYER DIELECTRIC

(75) Inventors: Randy Hoffman, Corvallis, OR (US); Peter Mardilovich, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 246 days.

(21) Appl. No.: 10/971,336

(22) Filed: Oct. 22, 2004

(65) Prior Publication Data

US 2006/0086936 A1  Apr. 27, 2006

(51) Int. Cl.
*H01L 21/00* (2006.01)
*H01L 21/84* (2006.01)

(52) U.S. Cl. .................................. 438/149
(58) Field of Classification Search ........... 438/149
See application file for complete search history.

(56) References Cited

U.S. PATENT DOCUMENTS

| | | | |
|---|---|---|---|
| 4,065,781 A | 12/1977 | Gutknecht | |
| 5,457,460 A | 10/1995 | Tran et al. | |
| 5,744,864 A | 4/1998 | Cillessen | |
| 5,793,889 A | 8/1998 | Bushman | |
| 5,835,641 A | 11/1998 | Sotoda et al. | |
| 5,999,652 A | 12/1999 | Bushman | |
| 6,160,998 A | 12/2000 | Wright et al. | |
| 6,215,731 B1 | 4/2001 | Smith | |
| 6,232,157 B1 | 5/2001 | Dodabalapur et al. | |
| 6,255,942 B1 | 7/2001 | Knudsen | |
| 6,312,304 B1 | 11/2001 | Duthaler et al. | |
| 6,496,777 B2 | 12/2002 | Tennison et al. | |
| 6,677,571 B1 | 1/2004 | Clark et al. | |
| 6,795,772 B2 | 9/2004 | Lin et al. | |
| 6,967,616 B2 | 11/2005 | Etnyre | |
| 2001/0010567 A1 | 8/2001 | Rho | |
| 2002/0022307 A1 | 2/2002 | Park | |
| 2003/0047785 A1 | 3/2003 | Kawasaki | |
| 2003/0122122 A1 | 7/2003 | Iwata | |
| 2003/0189205 A1 | 10/2003 | Horikoshi | |
| 2004/0113149 A1 | 6/2004 | Kim | |
| 2006/0060857 A1* | 3/2006 | Mardilovich et al. ......... 257/66 |

FOREIGN PATENT DOCUMENTS

EP  1 443 130  8/2004

* cited by examiner

*Primary Examiner*—Sara Crane
*Assistant Examiner*—Samuel A. Gebremariam

(57) ABSTRACT

Embodiments of methods, apparatuses, components, and/or systems for forming transistor having a dual layer dielectric are described.

47 Claims, 3 Drawing Sheets

METHOD OF FORMING A TRANSISTOR HAVING A DUAL LAYER DIELECTRIC

BACKGROUND

Electronic devices, such as integrated circuits, smart packages and electronic displays, for example, may comprise one or more components, such as one or more thin film transistors (TFTs). Methods and/or materials utilized to form components and/or devices such as these may vary, and one or more of these methods and/or materials may have particular disadvantages. For example, use of such methods and/or materials may be time-consuming and/or expensive, may involve the use of non-low temperature processing, which may preclude the use of particular materials, and/or may not produce devices and/or components having the desired characteristics.

BRIEF DESCRIPTION OF THE DRAWINGS

Subject matter is particularly pointed out and distinctly claimed in the concluding portion of the specification. Claimed subject matter, however, both as to organization and method of operation, together with objects, features, and advantages thereof, may best be understood by reference of the following detailed description when read with the accompanying drawings in which:

DETAILED DESCRIPTION

Figure 1:
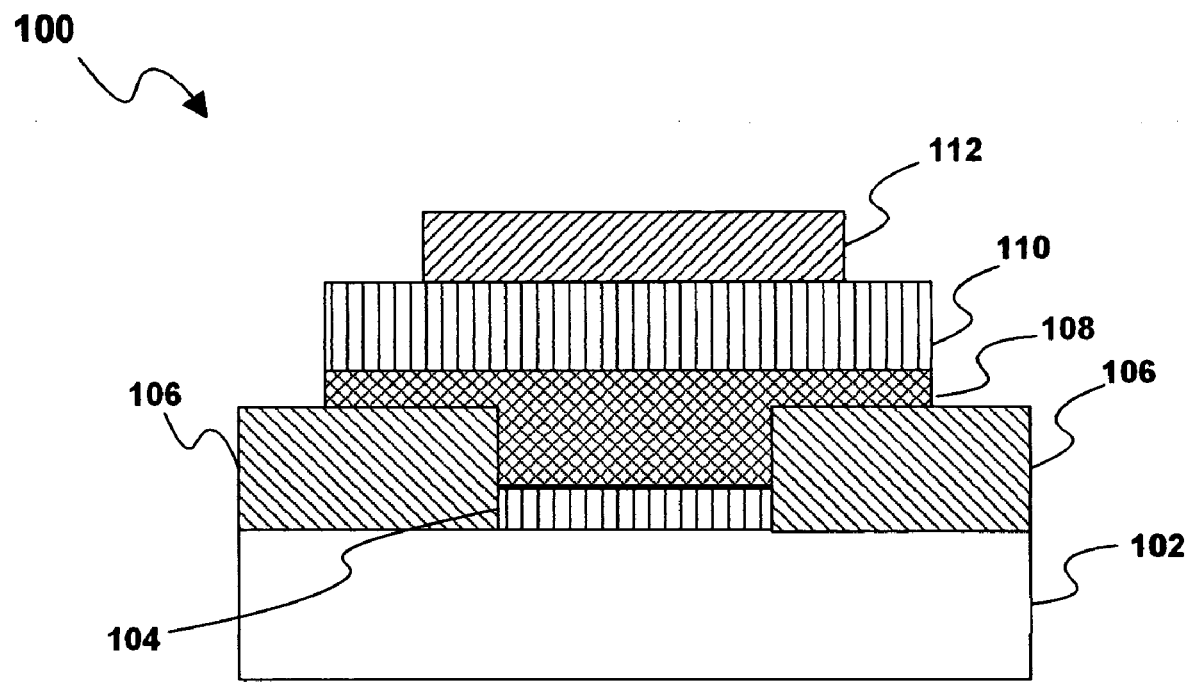
FIG. 1 is a cross sectional view of one embodiment of a thin film transistor.

In the following detailed description, numerous specific details are set forth to provide a thorough understanding of claimed subject matter. However, it will be understood by those skilled in the art that claimed subject matter may be practiced without these specific details. In other instances, well-known methods, procedures, components and/or circuits have not been described in detail so as not to obscure claimed subject matter.

Electronic devices, such as semiconductor devices, display devices, nanotechnology devices, conductive devices, and dielectric devices, for example, may comprise one or more electronic components. The one or more electronic components may comprise one or more thin film components, which may be comprised of one or more thin films. In this context, the term thin film refers to a layer of one or more materials formed to a thickness, such that surface properties of the one or more materials may be observed, and these properties may vary from bulk material properties. Thin films may additionally be referred to as component layers, and one or more component layers may comprise one or more layers of material, which may be referred to as material layers, for example. The one or more material and/or component layers may have electrical and/or chemical properties, such as conductivity, chemical interface properties, charge flow, and processability, for example. The one or more material and/or component layers may additionally be patterned, for example. The one or more material and/or component layers, in combination with one or more other material and/or component layers may form one or more electrical components, such as thin film transistors (TFTs), capacitors, diodes, resistors, photovoltaic cells, insulators, conductors, optically active components, or the like. Components such as TFTs, in particular, may, for example, be utilized in components including smart packages and display components including, for example, radio frequency identification (RFID) tags and electroluminescent and a liquid crystal displays (LCD), such as active matrix liquid crystal display (AMLCD) devices, for example.

At least as part of the fabrication process of electronic components, such as thin film transistors, for example, one or more layers of material may be formed at least as part of one or more of the component layers, such as by forming at least a portion of an electrode, including source, drain and/or gate electrodes; a channel layer; and/or a dielectric layer, for example, and these one or more layers of material may be formed on or over a substrate, for example. In at least one embodiment, one or more of the component layers of the TFT may comprise multiple material layers, such as a dual layer component layer, wherein the component layer is comprised of two material layers, wherein the two layers may have differing properties, for example. In at least one embodiment, and as at least a part of the fabrication process, one or more material layers may be formed by use of one or more processes and/or materials, and, additionally, the two layers of a dual layer component layer may be formed from differing processes and materials, for example. In at least one embodiment, one or more processes utilized may comprise one or more low temperature processes. In this context, low temperature processing refers to one or more processes that may be performed at relatively low temperatures as compared to one or more other processes. For example, processes such as may be utilized to form material layers of a TFT, for example, may be performed at particular temperatures, such as temperatures equal to or less than approximately 300 degrees Celsius, including processes performed at approximately 125 degrees Celsius, for example, although particular ranges may depend in part on the type of materials and/or processes utilized, and claimed subject matter is not limited in this respect. These particular processes may be referred to as low temperature processes, for example, although this is just an example. Additionally, one or more materials may be suitable for use in low temperature processes, such as by being temperature sensitive. Particular materials may be categorized as temperature sensitive, meaning, in this context, that the materials are suitable for use in a component wherein the component may be formed by use of one or more low temperature processes. Additionally, the particular temperatures utilized to form one or more material layers may depend at least in part on the particular process and/or material being deposited, as will be explained in more detail later. In at least one embodiment, utilization of low temperature processes may provide the capability to utilize materials that would not be suitable for use in non-low temperature processes, for example. Additionally, use of low temperature materials and/or processes may result in the formation of a component, such as a TFT, having improved mechanical flexibility and/or resistance to mechanical failure such as by delamination and/or cracking, as compared to components formed by use of non-low temperature processes, such as non-low temperature processes, and may additionally result in the formation of a device having other properties, as will be explained in more detail later. However, it is worthwhile to note that claimed subject matter is not limited in this respect.

One or more processes and/or materials, such as low temperature processes and/or materials may be utilized to form one or more material and/or component layers of a component. For example, one or more temperature sensitive materials, such as temperature sensitive substrate materials, channel layer materials and/or dielectric layer materials may be utilized, and this may include materials that may have characteristics such as flexibility, for example, and/or may include materials not suitable for use in non-low temperature processes, for example. Additionally, one or more low temperature processes, such as solution processes, vacuum deposition processes including RF (radio frequency) sputtering, DC sputtering, and/or reactive sputtering, wherein the substrate may be unheated or maintained at a suitably low temperature, atomic layer deposition (ALD), and/or evaporation processes, including thermal and/or electron-beam evaporation, for example, may be utilized in at least one embodiment. Solution processing, as used in this context, comprises one or more processes, wherein a solution, such as a substantially liquid solution, a solid or solid or liquid precursor that may be at least partially dissolved in a liquid, or a colloidal dispersion may be deposited on or over one or more surfaces, such as on one or more surfaces of a substrate, by use of one or more deposition processes. Electrical components, such as TFTs, for example, which may be at least partially formed by solution processing may be referred to as solution processed components, for example. In one embodiment of solution processing, an ejection mechanism, such as an ink jet component, may deposit and/or jet one or more materials onto a surface, in order to substantially form a material layer, for example. Utilization of one or more ejection mechanisms, such as an ink jet component, including a thermal ink jet (TIJ) component, for example, may additionally be referred to as a direct write solution process, as just an example. Additionally, one or more spin coating processes and/or one or more contact printing processes, wherein one or more printing components may be capable of printing materials, such as liquid materials, on to a surface, may be utilized in one or more embodiments of solution processing, although these are just a few examples, and claimed subject matter is not so limited. For example, one or more dip coating and/or spray coating processes, screen printing processes, chemical bath deposition processes and/or successive ionic layer absorption and reaction processes may be utilized in one or more embodiments of solution processing, for example, although it is worthwhile to note that claimed subject matter is not limited to the use of solution processing to form one or more layers of material, for example. Additionally, as used herein, an ejection component, such as a jetting component, including an ink jet component, may comprise a mechanism capable of ejecting material such as liquid material, for example, and may eject material in the form of drops or mist, for example, such as mechanically and/or electrically, and/or in response to electrical signals, and may be capable of ejecting material in controlled portions, in a controlled manner, and/or in a controlled direction, for example. Additionally, an ejection component may operate by use of one or more ejection schemes, including piezo ejection, thermal ejection, continuous ejection, acoustic ejection and flex tensioned ejection, and may comprise multiple nozzles, for example, but, again, claimed subject matter is not limited to these examples.

Although claimed subject matter is not so limited, in one particular embodiment, an electronic component, such as a TFT, may be formed by use of at least one low temperature process and/or material. In this embodiment, the electronic component may comprise at least one component layer, such as a component layer comprising two or more layers of material, including a dual layer dielectric layer, for example. In this particular embodiment, the two or more layers of material may comprise differing materials and/or material having differing characteristics, such as differing electrical, chemical, and/or thermal characteristics. For example, at least one material layer may substantially comprise inorganic material, and at least one material layer may substantially comprise organic material, for example. However, it is worthwhile to note that claimed subject matter is not so limited. Additionally, it is noted that claimed subject matter is not limited with reference to the arrangement of the material layers. For example, an inorganic material may reside over or on an organic material and vice-versa. Likewise, in some embodiments, additional material layers may also be included, depending at least in part on the particular embodiment. Particular arrangement of the layers of a dielectric layer may provide particular properties, such as mechanical properties, as will be explained in more detail later.

Referring now to FIG. 1, there is illustrated a cross-sectional view of one embodiment 100 of an electronic component in a stage of formation. Electronic component 100, here, may comprise an electronic component formed by use of one or more low temperature processes and/or materials, for example, and may comprise a portion of a display device, such as a portion of an active-matrix liquid crystal display (AM LCD) device, such as a backplane, and/or a portion of a smart package, such as an RFID tag, as just a few examples. Embodiment 100, here, comprises substrate 102, with one or more component layers 104, 106, 108, 110 and/or 112 formed thereon. In one particular embodiment, component layer 104 may comprise a channel layer; component layer 106 may comprise an electrode layer, and may further comprise one or more drain and source electrodes, for example; component layer 108 may comprise a first portion of a dielectric layer; component layer 110 may comprise a second portion of a dielectric layer; and component layer 112 may comprise a gate electrode layer, which may include a gate electrode, for example. Additionally, one or more of the source and/or drain electrodes 106 may be electrically coupled to the channel layer 104, and at least a portion of the gate electrode layer 112 may be electrically coupled to one or more portions 108 and/or 110 of the dielectric layer. In this particular configuration, component 100 may be referred to as a top gate thin film transistor, which may refer to a transistor configured to have a gate layer formed on or over a dielectric layer, for example, although it is worthwhile to note that this is just one embodiment, and claimed subject matter is not limited in this respect, but may comprise other configurations such as a bottom gate transistor. Although not illustrated, in at least one embodiment, the transistor may comprise a configuration wherein the gate electrode may be formed below the dielectric layer, and a channel layer may be formed on or over at least a portion of the dielectric layer, for example, and the resultant component may be referred to as a bottom gate thin film transistor, although it is worthwhile to note that this is just one embodiment, and claimed subject matter is not limited in this respect. Additionally, it is noted, of course, here and throughout this description that claimed subject matter is not limited to the foregoing material and/or component layers being formed on one another. For example, other layers may be included, such as between various layers, so that layers, such as intervening layers, may be formed above or over one another rather than on one another, depending, for example, on the particular embodiment.

Although claimed subject matter is not limited to any particular material and/or combination of materials to form one or more of the layers and/or components illustrated in FIG. 1, in at least one embodiment, one or more of the component layers may comprise one or more of the materials described below. Additionally, it is worthwhile to note that claimed subject matter is not limited in this respect, and one or more of the component layers may comprise any material or combination of materials, such as low temperature processes and/or materials that may be suitable for use as one or more component layers, including materials exhibiting properties suitable for application as one or more component layers in an electronic component, for example. However, in this embodiment, where component layer 102 comprises a substrate layer, component layer 102 may comprise one or more materials suitable for use as a substrate, such as one or more materials that may be temperature sensitive. For example, substrate layer 102 may comprise one or more types of plastic and/or one or more organic substrate materials, such as polyimides (PI), including Kapton®, polyethylene terephthalates (PET), polyethersulfones (PES), polyetherimides (PEI), polycarbonates (PC), polyethylenenaphthalates (PEN), acrylics including polymethylmethacrylates (PMMA), and combinations thereof, but claimed subject matter is not so limited. Additionally, substrate layer 102 may also comprise one or more inorganic materials, including silicon, silicon dioxide, one or more types of glass, stainless steel and metal foils, including foils of aluminum and copper, for example, but claimed subject matter is not so limited. Additionally, in at least one embodiment, wherein a substrate material is substantially comprised of one or more metals, an insulator layer may be utilized in addition to the one or more metals to form the substrate, for example. In this embodiment, wherein component layer 106 comprises an electrode layer, and may comprise one or more source and/or drain electrodes, the source and/or drain electrodes may be comprised of one or more materials. For example, at least a portion of component layer 106 may be substantially comprised of indium tin oxide; other doped oxide semiconductors, such as n-type doped zinc oxide, indium oxide, and tin oxide; metals, such as Al, Ag, In, Sn, Zn, Ti, Mo, Au, Pd, Pt, Cu, W, Ni, and combinations thereof, as just a few examples. Additionally, in this particular embodiment, component layer 104 may comprise a channel layer. Component layer 104 may comprise one or more materials suitable for use as a channel layer, including, for example, zinc indium oxide, such as zinc indium oxide having a Zn:In atomic ratio approximately within the range of about 1:1 to about 1:8, and preferably within the range of about 1:3 to about 1:5, such as an atomic ratio of 1:4, as just an example. However, claimed subject matter is not so limited, and may additionally include oxide semiconductors such as tin oxide, indium oxide, gallium oxide, cadmium oxide, lead oxide, copper oxide, silver oxide and combinations thereof, and other semiconductor materials that can be processed at suitably low temperatures, for example. Additionally, in this embodiment, wherein component layer 112 comprises a gate layer, component layer 112 may comprise metals, such as Al, Ag, In, Sn, Zn, Ti, Mo, Au, Pd, Pt, Cu, Ni or combinations thereof; doped oxide semiconductors, such as n-type doped zinc oxide, indium oxide, or tin oxide, as just a few examples.

Continuing with this embodiment, component layers 108 and 110 may comprise at least a portion of a dielectric layer, such as a dual layer dielectric layer, for example. In one embodiment, component layers 108 and 110 may comprise one or more inorganic and/or organic materials, such as one or more material layers substantially comprising inorganic dielectric material, and/or one or more material layers substantially comprising organic dielectric materials, and, in at least one embodiment, the materials used to form layers 108 and 110 may be temperature sensitive, for example. In at least one embodiment, component layer 108 may comprise one or more inorganic dielectric materials, and component layer 110 may comprise one or more organic dielectric materials. In this embodiment, component layer 108 may comprise $AlO_x$, $SiO_x$, $SiN_x$, $SiO_xN_y$, $ZrO_x$, $TaO_x$, $HfO_x$, and combinations thereof, as just a few examples. Component layer 110 may comprise one or more organic dielectric materials, such as a UV curable monomers including UV curable acrylic monomer, acrylic polymer, UV curable monomer, thermal curable monomer, one or more types of glass, including solution processed glass, one or more glass resins including silsesquioxanes, polymer solution, including melted polymer and/or oligomer solution, poly methyl methacrylate, poly vinylphenol, benzocyclobutene, and one or more polyimides, as just a few examples.

As alluded to previously, and as will be explained in more detail later, one or more of these materials may have particular characteristics. For example, as mentioned previously, one or more materials may be temperature sensitive, meaning, for example, that the materials may be affected, such as physically, electrically and/or chemically, by temperatures exceeding a particular value. For example, substrate materials, channel layer materials and/or dielectric layer materials such as one or more of the materials mentioned previously may be temperature sensitive. These temperature sensitive materials may additionally be more flexible and/or resistant to mechanical failure than other materials, such as non-temperature sensitive materials, for example, although claimed subject matter is not so limited. Additionally, one or more materials may be lower cost as compared to other materials, for example. Additionally, formation of a component, wherein the component is comprised of multiple component layers, and at least one component layer is formed from a plurality of material layers, such as described herein may result in a component having particular properties, such as optical properties including transparency, such as if a substrate is substantially formed from PET, as just an example. Additionally, one or more components may have mechanical properties, such as more flexibility and/or resistance to mechanical failure than a component not having a component layer formed from a plurality of material layers, although claimed subject matter is not so limited, and mechanical properties such as these may depend at least in part on the one or more materials and/or processes utilized, for example. Thus, use of materials such as described above may result in the formation of a component having particular properties, such as mechanical properties, may be formed by use of one or more low temperature processes, and/or may provide lower cost components as compared to other components, as just a few examples. Further, use of low temperature materials and multiple material layers to form a component may result in the formation of a component having mechanical properties that may be desirable in numerous applications, for example.

Additionally, formation of a component having one or more organic and inorganic material layers may provide a component having particular properties. For example, in one embodiment, use of one or more of the aforementioned organic materials may result in a component layer that may be more readily processed as compared to one or more of the aforementioned inorganic materials, such as by having the capability of being processed at a relatively lower temperature as compared to one or more inorganic materials, but may not exhibit particularly desirable characteristics, such as by not exhibiting particularly desirable chemical and/or electrical interface characteristics, such as by exhibiting reduced film quality, channel mobility capabilities, and/or charge transport properties, which may reduce reliability, for example. Comparably, in one embodiment, one or more inorganic materials may exhibit one or more desirable characteristics, such as desirable chemical and/or electrical interface characteristics, such as desirable film quality, channel mobility capabilities, and/or charge transport properties, which may aid reliability, for example, but may be comparatively difficult to process. Thus, use of a dual layer dielectric layer wherein the dielectric layer comprises organic and inorganic material may result in a component having particular properties, such as dielectric properties, charge transport properties, and/or mechanical properties, including flexibility, for example. It is noted here and through out this description that claimed subject matter is not so limited, and these particular characteristics are used for illustrative purposes only, and particular materials utilized in one or more embodiments may not necessarily exhibit one or more of these characteristics.

Figure 2:
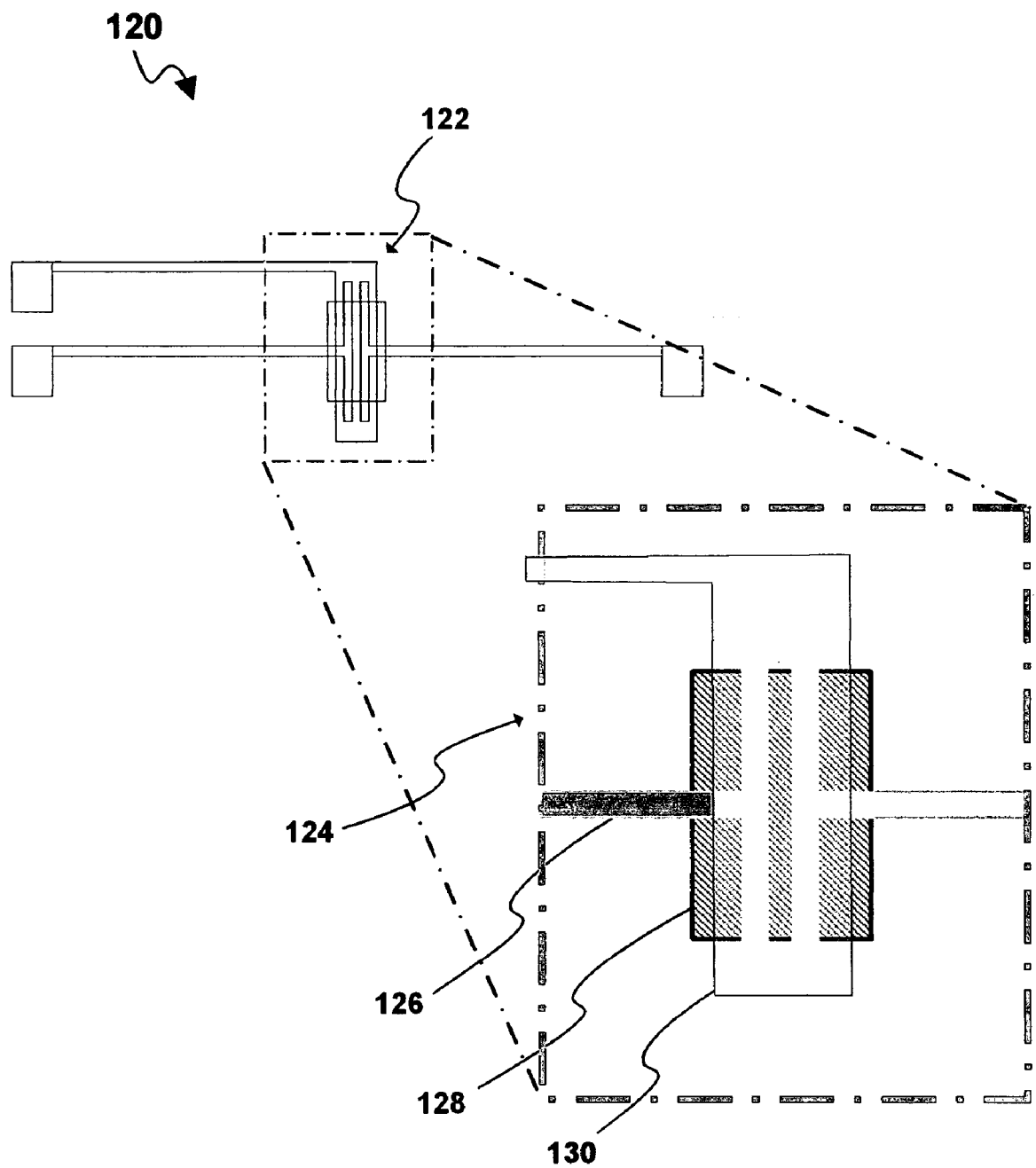
FIG. 2 is a plan view of one embodiment of a thin film transistor.

Referring now to FIG. 2, there is illustrated an embodiment 120 of a component processed by use of one or more low temperature processes and/or materials, illustrated as a plan view. Component 122, here, may comprise a thin film component, such as component 100 of FIG. 1, for example, and may comprise a top gate thin film transistor, although claimed subject matter is not limited in this respect. Additionally, component 122 may comprise a portion of an electronic device, such as a liquid crystal display (LCD) device, as just an example. In this embodiment, component 122 may comprise a channel portion 128; an electrode portion 126, which may comprise a source and/or drain, a dielectric portion 124; and a gate portion 130, although, again, claimed subject matter is not so limited. Additionally, one or more of the foregoing portions may be formed on or over a substrate (not shown), for example, and may substantially comprise layers, such as one or more material layers and/or component layers, for example. In one particular embodiment, one or more of the portions may be formed proximate to one or more other portions, such as above and/or below one or more portions, such as in a similar configuration as the embodiment 100 illustrated in FIG. 1, for example, and may be electrically coupled, for example, although claimed subject matter is not so limited. However, in this embodiment, channel portion 128 and electrode portion 126 may be formed on a substrate (not shown). Dielectric portion 124 may be formed on at least a portion of electrode portion 126 and/or channel portion 128. Formed on at least a portion of dielectric portion 124 is gate portion 130, in this particular embodiment.

Additionally, and as described in reference to FIG. 1, although claimed subject matter is not limited to any particular material and/or combination of materials to form one or more of the layers and/or components illustrated in FIG. 2, in at least one embodiment, one or more of the component layers may comprise one or more of the aforementioned materials. However, similar to FIG. 1, it is worthwhile to note that claimed subject matter is not limited in this respect, and one or more of the component layers may comprise any material or combination of materials suitable for use as one or more component layers, such as any material exhibiting properties suitable for application as one or more component layers in an electronic component. For example, one or more of the aforementioned temperature sensitive materials may be utilized, and this may result in the formation of a component, wherein at least a portion of the component is formed by use of low temperature processing, for example. In at least one embodiment, the component formed by use of low temperature processing may exhibit particular characteristics, including mechanical flexibility, for example.

Formation of one or more layers of component 100 of FIG. 1 and/or component 122 of FIG. 2 may comprise one or more processes, and/or numerous process operations, such as one or more low temperature processes, but claimed subject matter is not limited to any particular method of formation of one or more layers and/or one or more electrodes of components 100 and/or 122. However, in at least one embodiment, one or more low temperature processes may be utilized, including: one or more solution processes, including one or more ejection processes such as ink jet processes, thermal ink jet processes, contact printing processes, spin coating, dip coating, spray coating, curtain coating and/or screen printing processes, and/or chemical bath deposition and/or successive ionic layer absorption reaction, as just a few examples. Additionally, one or more vacuum deposition processes, including evaporation processes, including thermal and electron-beam evaporation; atomic layer deposition (ALD); sputtering processes such as RF sputtering, DC sputtering, and reactive sputtering, wherein the substrate may be unheated or maintained at a suitably low temperature, may be utilized in at least one embodiment, but again, claimed subject matter is not so limited. Additionally, depending at least in part on the one or more materials utilized to form a device and/or the particular processes utilized, one or more post-deposition processes, which may be referred to as post-processing, and may include one or more thermal, chemical and photochemical treatments, may be utilized in the formation process, such as one or more annealing processes and ultraviolet (UV) curing processes, for example, although, again, claimed subject matter is not so limited. Although claimed subject matter is not so limited, in one particular embodiment, an electronic component, such as component 100, may be formed by use of one or more processes that may reduce and/or eliminate the use of one or more post-deposition processes, for example. In this embodiment, one or more evaporation and/or low power sputtering processes may be utilized, and this may result in a reduced and/or eliminated need for post-deposition processes such as thermal treatment, in at least one embodiment.

The components illustrated in FIGS. 1 and/or 2 may be formed by use of a computer controlled formation system (not shown), which may be capable of providing material, patterning and/or post-deposition processing to at least a portion of one or more portions of a component. A formation system used to form one or more of the illustrated components may, for example, comprise a deposition device (not shown), capable of disposing material on or over one or more layers. In at least one embodiment, a deposition device may comprise an ejection device, which may comprise a jetting device, and may be configured to apply material, such as conductive, nonconductive and/or dielectric material to locations on or over a component, such as to form one or more portions of component 100, for example. Additionally, a formation system may comprise a post-deposition processing device, such as a UV device capable of generating UV energy, or a laser capable of generating a laser beam at a frequency in the electromagnetic spectrum and having suitable energy to provide intense localized or "spot" heating, for example (not shown), although this is just one example, and claimed subject matter is not limited in this respect. However, particular methods of formation of the components illustrated herein may be better understood when explained with reference to FIG. 3, below.

Figure 3:
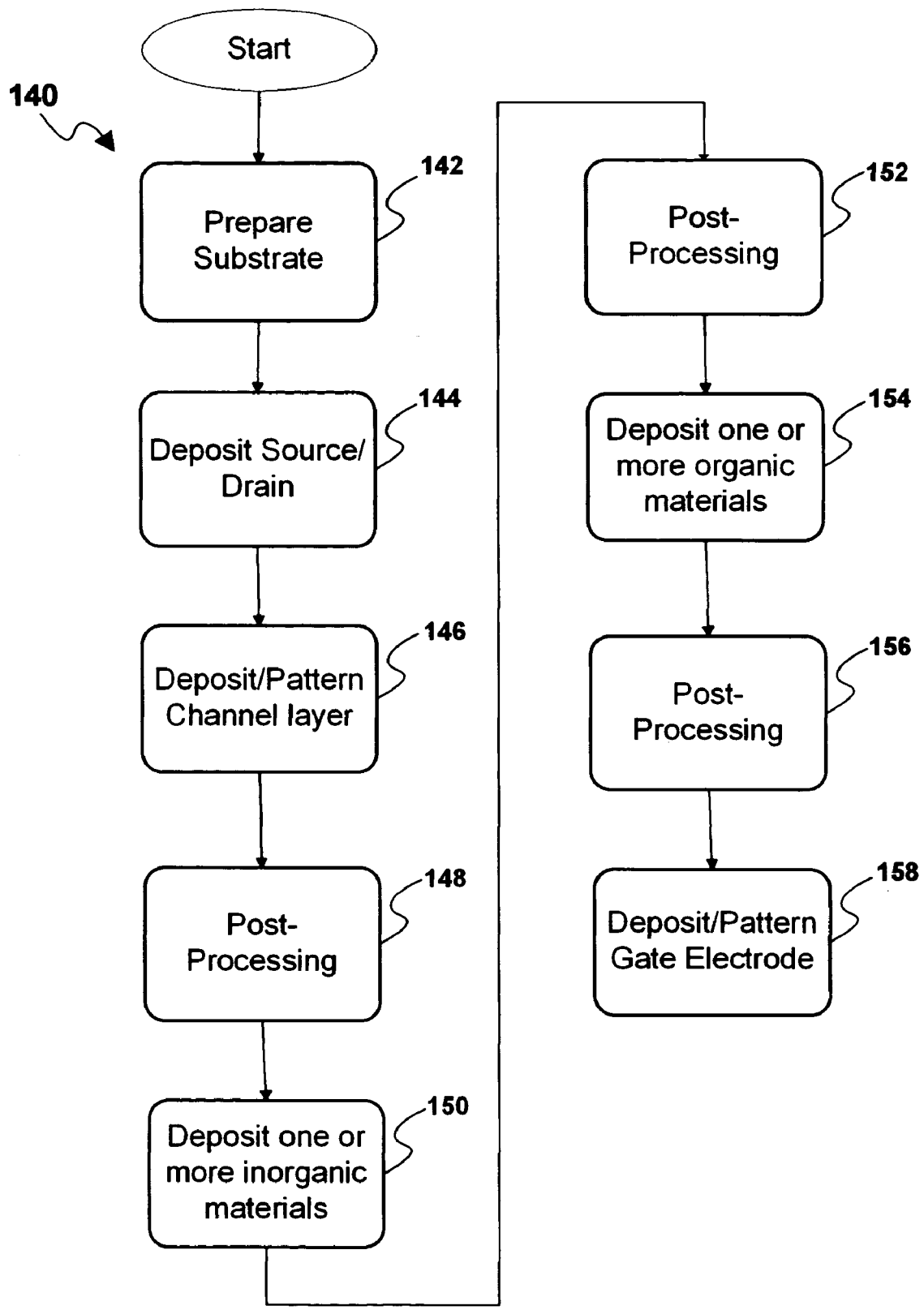
FIG. 3 is a flowchart illustrating one embodiment of a method to form a thin film transistor.

Referring now to FIG. 3, one embodiment of a technique for forming a transistor having a dual layer gate dielectric, such as by use of one or more low temperature processes is illustrated by a flowchart, although, of course, claimed subject matter is not limited in scope in this respect. Such an embodiment may be employed to at least partially form an electronic device by use of one or more low temperature processes, wherein the electronic device comprises at least one component, and the at least one component comprises a dual layer dielectric layer, as described below. The flowchart illustrated in FIG. 3 may be used to form at least a portion of a component, such as component 100 of FIG. 1 and/or component 122 of FIG. 2, for example, although claimed subject matter is not limited in this respect. Likewise, the order in which the blocks are presented does not necessarily limit claimed subject matter to any particular order. Additionally, intervening blocks not shown may be employed without departing from the scope of claimed subject matter.

Flowchart 140 depicted in FIG. 3 may, in alternative embodiments, be at least partially implemented in a combination of hardware and software and/or firmware, such as the aforementioned computer controlled formation system, for example, and may comprise discrete and/or continual operations. In this embodiment, one or more materials may be disposed on or over at least a portion of a component, such as a partially formed component, such as to form one or more layers, such as one or more layers illustrated as part of component 100 of FIG. 1 and/or component 122 of FIG. 2, for example. In this embodiment, at block 142, a substrate may be prepared, which may include cleaning and/or processing of the surface of the substrate, for example. Source and drain electrodes may be deposited and/or patterned at block 144. At block 146, a channel layer may be deposited and/or processed. At block 148, one or more post-processes may be performed on one or more of the aforementioned component layers. At block 150, one or more inorganic materials may be deposited, such as by a low temperature processes, for example. At block 152, a portion of the one or more inorganic materials may be post-processed, such as by selectively removing at least a portion of the one or more inorganic materials, and/or altering at least a portion of the one or more inorganic materials, explained in more detail later. At block 154, one or more organic materials may be deposited, such as by a low temperature process, for example. At block 156, such as similar to block 152, a portion of the one or more organic materials may be post-processed, such as by selectively removing at least a portion of the one or more organic materials, and/or altering at least a portion of the one or more inorganic materials, explained in more detail later. At block 158, a gate electrode layer may be deposited and/or patterned. Although the order in which the blocks are presented in FIG. 3 may be utilized to form at least one embodiment of a top gate TFT, claimed subject matter is not so limited, and the order in which the blocks are presented may be altered such as to produce a bottom gate TFT, such as described previously.

However, in this embodiment, at block 142, at least a portion of a substrate may be prepared, such as a substrate substantially comprising plastic and/or one or more organic substrate materials, such as polyimides (PI), including Kapton®, polyethylene terephthalates (PET), polyethersulfones (PES), polyetherimides (PEI), polycarbonates (PC), polyethylenenaphthalates (PEN), acrylics including polymethylmethacrylates (PMMA), and combinations thereof, one or more inorganic materials, including silicon, silicon dioxide, one or more types of glass, stainless steel, metal foils, including foils of aluminum and copper, for example, but claimed subject matter is not so limited. Additionally, in at least one embodiment, wherein a substrate material is substantially comprised of one or more metals, an insulator layer may be utilized in addition to the one or more metals to form the substrate, for example. In at least one embodiment, preparing the substrate may comprise cleaning the substrate, such as by washing, for example, and/or may comprise depositing one or more materials on the substrate. Additionally, preparing the substrate may comprise processing the surface of the substrate such that a desired surface roughness or surface finish may be obtained, to improve adhesion of subsequently deposited layers, and/or to reduce deleterious chemical interactions with subsequently deposited layers, for example, although, of course, claimed subject matter is not so limited. Additionally, in at least one embodiment, no substrate preparation may be performed, and selection of particular preparations of a substrate surface may depend at least in part on the particular material or combination of materials selected to form a substrate. In one particular example, a substrate, such as a substrate substantially comprising polyimide may be prepared. In this example embodiment, an inorganic dielectric material, such as aluminum oxide, may be deposited on at least one surface of the substrate prior to the formation of one or more component layers, for example. This may result in a component exhibiting particular properties, such as electrical properties, that may not be exhibited by a component having a substrate prepared in this manner, for example.

At block 144, source and drain electrodes may be deposited and/or patterned. This may comprise depositing one or more of the aforementioned materials by use of one or more of the aforementioned processes, such as by depositing indium tin oxide by use of RF sputtering, for example. Additionally, the source and/or drain electrodes may be patterned. In this context, patterned may comprise selectively altering and/or removing at least a portion of the deposited material, such as to form material having a particular shape and/or configuration, for example. In at least one embodiment, patterning may be performed by etching, dissolving, lift-off, laser ablation, direct deposition patterning via inkjet, or other processes resulting in the removal of at least a portion of the source and/or drain electrodes, for example. However, selection of particular patterning processes of a source and/or drain electrode may depend at least in part on the particular material or combination of materials selected to form the source and/or drain electrode, for example.

In this embodiment, at block 146, a channel layer may be deposited and/or patterned. The channel layer may be deposited on at least a portion of the source and/or drain electrodes and/or the substrate, for example, although numerous other configurations may exist, as explained later. However, in this embodiment, a channel layer may be formed by use of one or more of the aforementioned processes and/or materials, such as by depositing zinc indium oxide on at least a portion of the substrate and/or source and/or drain electrodes by use of one or more RF sputtering processes, for example. Additionally, the channel layer may be patterned. In at least one embodiment, patterning may be performed by etching, dissolving, lift-off, laser ablation, direct deposition patterning via inkjet, or other processes resulting in the removal of at least a portion of the channel layer, for example. Alternatively, no patterning may be performed, and selection of particular patterning processes of a channel layer may depend at least in part on the particular material or combination of materials selected to form the channel layer, for example. At block 148, one or more post-processes may be performed on one or more of the materials deposited in one or more of the aforementioned processes, for example. For example, the substrate with source/drain electrodes and channel layer may be annealed, such as by use of a laser, a microwave source, and/or by use of an annealing oven or furnace, for example. However, numerous other post-processes exist, and selection of a particular post process may depend at least in part on the particular processes and/or materials utilized to form one or more of the aforementioned layers, for example. Additionally, no post processing may be performed, if, for example, the one or more materials deposited do not necessitate the use of one or more post processes, for example.

In this embodiment, at block 150, one or more inorganic materials may be deposited and/or processed, such as by depositing one or more inorganic materials on at least a portion of one or more of the layers formed in one or more of the aforementioned processes, including, for example, a substrate layer, a channel layer, and/or an electrode layer, as just a few examples. As illustrated in FIG. 1, one or more inorganic dielectric materials may be deposited over at least a portion of a channel layer, substrate and/or one or more electrodes, such that dielectric layer 108 is formed. In this embodiment, layer 108 may comprise one or more inorganic materials, including $AlO_x$, $SiO_x$, $SiN_x$, $SiO_xN_y$, $ZrO_x$, $TaO_x$, $HfO_x$ or combinations thereof, for example, although, of course, claimed subject matter is not limited in this respect. Additionally, deposition of one or more inorganic materials may comprise one or more low temperature processes, such as one or vacuum deposition processes including sputtering processes, such as RF sputtering, DC sputtering, and reactive sputtering; atomic layer deposition (ALD); and one or more evaporation processes, including thermal and electron-beam evaporation, for example. Additionally, at block 152, at least a portion of the inorganic material(s) may be post-processed. Post-processing may comprise thermal annealing, such as by use of a laser, a microwave source, and/or by use of an annealing oven or furnace, for example. However, numerous other post-processes exist, and selection of a particular post process may depend at least in part on the particular processes and/or materials utilized to form one or more of the aforementioned layers, for example. Additionally, no post processing may be performed, if, for example, the one or more materials deposited do not necessitate the use of one or more post processes, for example.

In this embodiment, at block 154, one or more organic materials may be deposited, such as by depositing one or more organic materials on at least a portion of one or more of the layers formed in one or more of the aforementioned processes, including, for example, a substrate layer, a channel layer, an electrode layer and/or a dielectric layer, such as an inorganic dielectric layer. As illustrated in FIG. 1, one or more organic dielectric materials may be deposited such that dielectric layer 110 is formed. In this embodiment, one or more organic materials, such as temperature sensitive materials, including UV curable acrylic monomer, acrylic polymer, UV curable monomer, thermal curable monomer, polymer solution, including melted polymer and oligomer solution, poly methyl methacrylate, poly vinylphenol, benzocyclobutene, one or more polyimides, and combinations thereof, as just a few examples, although, of course, claimed subject matter is not limited in this respect. Additionally, deposition of one or more organic materials may comprise one or more low temperature processes, such as one or more solution processes, including thermal ink jet (TIJ) processes, one or more spin coating processes, one or more contact printing processes, one or more dip coating and/or spray coating processes, screen printing processes, chemical bath deposition processes and/or successive ionic layer absorption and reaction processes, for example. Additionally, the one or more materials deposited may be in one or more forms, such as in a substantially liquid form, in a nanoparticle suspension form, in an inorganic polymer sol-gel precursor form, including partially hydrolyzed/oligomerized metal alkoxides in an alcohol solution, and/or one or more types of oxide and/or precursor forms, such as metal alkoxides, metal salts, and/or partially polymerized metal alkoxides, as just a few examples. Additionally, at block 156, at least a portion of the inorganic material(s) may be post-processed. Post-processing may comprise thermal annealing, such as by use of a laser, a microwave source, and/or by use of an annealing oven or furnace, for example. However, numerous other post-processes exist, and selection of a particular post process may depend at least in part on the particular processes and/or materials utilized to form one or more of the aforementioned layers, for example. Additionally, no post processing may be performed, if, for example, the one or more materials deposited do not necessitate the use of one or more post processes, for example.

In this embodiment, at block 158, one or more gate electrodes may be deposited and/or patterned. This may comprise depositing one or more of the aforementioned materials by use of one or more of the aforementioned processes, such as by depositing metals, including Al, Ag, In, Sn, Zn, Ti, Mo, Au, Pd, Pt, Cu, Ni, and combinations thereof, doped oxide semiconductors, such as n-type doped zinc oxide, indium oxide, and tin oxide by use of one or more deposition processes, such as evaporation, sputtering, and one or more solution processes, and selection of particular deposition processes of a gate electrode may depend at least in part on the particular material or combination of materials selected to form the gate electrode, for example. Additionally, the gate electrode may be patterned, such as by selectively altering and/or removing at least a portion of the deposited material, such as to form material having a particular shape and/or configuration, for example. In at least one embodiment, patterning may be performed by etching, dissolving, lift-off, laser ablation, direct deposition patterning via inkjet or other methods, and/or otherwise removing at least a portion of the gate electrode, for example. However, selection of particular patterning processes of a gate electrode may depend at least in part on the particular material or combination of materials selected to form the source and/or drain electrode, for example.

As alluded to previously, formation of one or more material and/or component layers in the foregoing manner and/or by use of one or more of the foregoing materials may result in the formation of an electronic component and/or an electronic device having particular characteristics that may vary from a component not being formed in this manner and/or from this particular combination of materials. For example, a thin film transistor may be formed in this manner, and may result in the formation of a thin film transistor by use of one or more low temperature processes and/or materials, and may result in a TFT having desirable characteristics, such as by having desirable mechanical properties including flexibility, resistance to mechanical failure such as by delamination and/or cracking, lower cost, and may also have one or more electrical, physical and/or chemical properties, for example.

It is, of course, now appreciated, based at least in part on the foregoing disclosure, that a combination of hardware and software and/or firmware may be produced capable of performing a variety of operations, including one or more of the foregoing operations, which may be implemented in a system suitable for forming a transistor having a dual layer gate dielectric, as described previously. It will additionally be understood that, although particular embodiments have just been described, claimed subject matter is not limited in scope to a particular embodiment or implementation. For example, a system capable of implementing one or more of the foregoing operations described in reference to FIG. 3 may comprise hardware, such as implemented to operate on a device or combination of devices as previously described, for example, whereas another embodiment may be in software and hardware, for example. Likewise, an embodiment of a system capable of implementing one or more of the abovementioned operations may be implemented in firmware, or as any combination of hardware, software, and/or firmware, for example. Additionally, all or a portion of one embodiment may be implemented to operate at least partially in one device, such as an ejection device, a laser device, a display, a computing device, a set top box, a cell phone, and/or a personal digital assistant (PDA), for example. Likewise, although claimed subject matter is not limited in scope in this respect, one embodiment may comprise one or more articles, such as a storage medium or storage media. This storage media, such as, one or more CD-ROMs and/or disks, for example, may have stored thereon instructions, that when executed by a system, such as a computer system, computing platform, a set top box, a cell phone, and/or a personal digital assistant (PDA), and/or other system, for example, may result in an embodiment of a method in accordance with claimed subject matter being executed, such as one of the embodiments previously described, for example. As one potential example, a computing platform may include one or more processing units or processors, one or more input/output devices, such as a display, a keyboard and/or a mouse, and/or one or more memories, such as static random access memory, dynamic random access memory, flash memory, and/or a hard drive, although, again, claimed subject matter is not limited in scope to this example.

In the preceding description, various aspects of claimed subject matter have been described. For purposes of explanation, specific numbers, systems and/or configurations were set forth to provide a thorough understanding of claimed subject matter. However, it should be apparent to one skilled in the art having the benefit of this disclosure that claimed subject matter may be practiced without the specific details. In other instances, well-known features were omitted and/or simplified so as not to obscure claimed subject matter. While certain features have been illustrated and/or described herein, many modifications, substitutions, changes and/or equivalents will now occur to those skilled in the art. It is, therefore, to be understood that the appended claims are intended to cover all such modifications and/or changes as fall within the true spirit of claimed subject matter.

The invention claimed is:

1. A method, comprising: forming a channel layer over at least a portion of a substrate, wherein said channel layer substantially comprises zinc indium oxide;
   depositing a first material over at least a portion of a substrate by use of one or more low temperature processes to form a first portion of a dielectric layer, at least a portion of said first portion of the dielectric layer comprising inorganic dielectric material;
   depositing a second material over and/or in contact with said first portion of the dielectric layer by use of one or more solution processes to form a second portion of the dielectric layer, at least a portion of said second portion of the dielectric layer comprising organic dielectric material, such as to form at least a portion of a thin film transistor (TFT).

2. The method of claim 1, wherein said first portion of the dielectric layer is formed in contact with at least a portion of said channel layer.

3. The method of claim 1, and further comprising forming a gate electrode over and/or in contact with at least a portion of said second portion of the dielectric layer.

4. The method of claim 3, and further comprising forming a source electrode and a drain electrode over at least a portion of the substrate.

5. The method of claim 4, and further comprising post-processing at least a portion of said first portion of the dielectric layer, said second portion of the dielectric layer, said channel layer, said source and drain electrodes, and/or said gate electrode.

6. The method of claim 5, wherein said post-processing comprises one or more of the following: an annealing process and an ultraviolet (UV) curing process.

7. The method of claim 6, wherein said post-processing is performed after the deposition of a particular dielectric layer, but prior to the deposition of one or more subsequent dielectric layers.

8. The method of claim 4, and further comprising: patterning at least a portion of said source and drain electrodes, said channel layer, said first portion of the dielectric layer, said second portion of the dielectric layer and/or said gate electrode.

9. The method of claim 4, wherein said channel layer is formed on said substrate, said source and drain electrodes are formed on at least a portion of said substrate and/or said channel layer, said first portion of the dielectric layer is formed on at least a portion of said channel layer and/or said source and drain electrodes, said second portion of the dielectric layer is formed on at least a portion of said first portion of the dielectric layer, and said gate electrode is formed on at least a portion of said second portion of the dielectric layer, such as to form at least a portion of a top gate thin film transistor.

10. The method of claim 4, wherein said gate electrode is formed on said substrate, said second portion of the dielectric layer is formed on at least a portion of said gate electrode and/or said substrate, said first portion of the dielectric layer is formed on at least a portion of said second portion of the dielectric layer, said source and drain electrodes are formed on at least a portion of said second portion of the dielectric layer, and said channel layer is formed on at least a portion of said second portion of the dielectric layer and/or said source and drain electrodes, such as to form at least a portion of a bottom gate thin film transistor.

11. The method of claim 1, wherein said solution processes comprise one or more of the following processes: ejection, contact printing, screen printing, dip coating, and spray coating.

12. The method of claim 11, wherein said ejection process comprises a thermal inkjet process.

13. The method of claim 4, wherein said source and drain electrodes substantially comprise indium tin oxide.

14. The method of claim 3, wherein said gate electrode substantially comprises indium tin oxide.

15. The method of claim 1, wherein said channel layer substantially comprises zinc indium oxide having a Zn:In atomic ratio approximately within the range of about 1:1 to about 1:8.

16. The method of claim 1, wherein said channel layer substantially comprises zinc indium oxide having a Zn:In atomic ratio approximately within the range of about 1:3 to about 1:5.

17. The method of claim 1, wherein said inorganic dielectric material comprises one or more of the following: $AlO_x$, $SiO_x$, $SiN_k$, $SiO_xN_y$, $ZrO_x$, $TaO_x$, $HfO_x$ and combinations thereof.

18. The method of claim 1, wherein said wherein said organic dielectric material comprises one or more of the following: UV curable monomers including UV curable acrylic monomers, acrylic polymers, thermal curable monomers, polymer solutions, melted polymer and/or oligomer solutions, poly methyl methacrylates, poly vinylphenols, benzocyclobutenes, one or more polyimides, and combinations thereof.

19. The method of claim 1, wherein said substrate comprises one or more of the following: plastics and/or one or more organic substrate materials, including polyimides (PI), polyethylene terephthalates (PET), polyethersulfones (PES), polyetherimides (PEI), polycarbonates (PC), polyethylenenaphthalates (PEN), acrylics, polymethylmethacrylates (PMMA), and combinations thereof, one or more inorganic materials, including silicon, silicon dioxide, one or more types of glass, stainless steel, metal foils, including foils of aluminum and copper, and combinations thereof.

20. The method of claim 1, wherein said one or more low temperature processes are substantially performed within a range of temperature less than approximately 300 degrees Celsius.

21. The method of claim 1, wherein said one or more low temperature processes comprises one or more of the following: vacuum deposition, including RF sputtering, DC sputtering and reactive sputtering, atomic layer deposition (ALD), and evaporation; and one or more solution processes.

22. A method of forming a thin film transistor, comprising:
a step for forming a source and drain electrode over at least a portion of a substrate;
a step for forming a channel layer over at least a portion of the substrate, said channel layer substantially comprising zinc indium oxide.
a step for depositing a first material over at least a portion of a substrate by use of one or more steps for low temperature processing to form a first portion of a dielectric layer, at least a portion of said first material layer comprising inorganic dielectric material;
a step for depositing a second material over and/or in contact with said first portion of the dielectric layer by use of one or more steps for solution processing to form a second portion of the dielectric layer, at least a portion of said second material layer comprising organic dielectric material; and
a step for forming a gate electrode over and/or in contact with at least a portion of said second portion of the dielectric layer, such as to form at least a portion of a thin film transistor (TFT).

23. The method of claim 22, and further comprising:
a step for patterning at least a portion of said source and drain electrodes, said channel layer, said first portion of the dielectric layer, said second portion of the dielectric layer and/or said gate electrode.

24. The method of claim 22, wherein one or more steps for low temperature processing include: vacuum deposition, including RF sputtering, DC sputtering, reactive sputtering, atomic layer deposition (ALD), and evaporation; and one or more steps for solution processing.

25. The method of claim 24, wherein said one or more steps for solution processing comprise one or more of the following: ejection, contact printing, screen printing, dip coating, and spray coating.

26. The method of claim 24, wherein said one or more steps for low temperature processing are substantially performed within a range of temperature less than approximately 300 degrees Celsius.

27. The method of claim 22, and further comprising post-processing at least a portion of said first portion of the dielectric layer, said second portion of the dielectric layer, said channel layer, said source and drain electrodes, and/or said gate electrode by use of at least one annealing process and/or ultraviolet (UV) curing process.

28. The method of claim 22, wherein said source and said drain electrodes at least partially comprise indium tin oxide.

29. The method of claim 22, wherein said channel layer substantially comprises zinc indium oxide having a Zn:In atomic ratio approximately within the range of about 1:1 to about 1:8.

30. The method of claim 29, wherein said channel layer substantially comprises zinc indium oxide having a Zn:In atomic ratio approximately within the range of about 1:3 to about 1:5.

31. The method of claim 22, wherein said inorganic dielectric material comprises one or more of the following: $AlO_x$, $SiO_x$, $SiN_x$, $SiO_xN_y$, $ZrO_x$, $TaO_x$, $HfO_x$ and combinations thereof.

32. The method of claim 22, wherein said wherein said organic dielectric material comprises one or more of the following: UV curable monomers including UV curable acrylic monomers, acrylic polymers, thermal curable monomers, polymer solutions, melted polymer and/or oligomer solutions, poly methyl methacrylates, poly vinylphenols, benzocydobutenes, one or more polyimides, and combinations thereof.

33. The method of claim 22, wherein said substrate comprises one or more of the following: plastics and/or one or more organic substrate materials, including polyimides (PI), polyethylene terephthalates (PET), polyethersulfones (PES), polyetherimides (PEI), polycarbonates (PC), polyethylenenaphthalates (PEN), acrylics, polymethylmethacrylates (PMMA), and combinations thereof, one or more inorganic materials, including silicon, silicon dioxide, one or more types of glass, stainless steel, metal foils, including foils of aluminum and copper, and combinations thereof.

34. A thin film transistor (TFT), formed substantially by a process comprising:
forming a source and drain electrode over at least a portion of a substrate;
forming a channel layer over at least a portion of the substrate, said channel layer substantially comprising zinc indium oxide.
depositing a first material over at least a portion of a substrate by use of one or more low temperature processes to form a first portion of a dielectric layer, at least a portion of said first material layer comprising inorganic dielectric material;
depositing a second material over and/or in contact with said first portion of the dielectric layer by use of one or more solution processes to form a second portion of the dielectric layer, at least a portion of said second material layer comprising organic dielectric material; and forming a gate electrode over and/or in contact with at least a portion of said second portion of a dielectric layer such that at least a portion of a thin film transistor (TFT) is formed.

35. The TFT of claim 34, wherein said source and said drain electrodes at least partially comprise indium tin oxide.

36. The TFT of claim 34, and further comprising:
patterning at least a portion of said source and drain electrodes, said channel layer, said first portion of the dielectric layer, said second portion of the dielectric layer and/or said gate electrode.

37. The TFT of claim 34, wherein at least a portion of said source and drain electrodes, said channel layer, said first and said second portions of the dielectric layer and/or said gate electrode are formed by use of one or more low temperature processes.

38. The TFT of claim 37, wherein said one or more low temperature processes are substantially performed within a range of temperature less than approximately 300 degrees Celsius.

39. The TFT of claim 37, wherein one or more low temperature processes include: vacuum deposition, including RF sputtering, DC sputtering, reactive sputtering, atomic layer deposition (ALD), and evaporation; and one or more solution processes.

40. The TFT of claim 37, wherein said one or more solution processes comprise one or more of the following: ejection, contact printing, screen printing, dip coating, spray coating, screen printing, chemical bath deposition, and successive ionic layer absorption and reaction.

41. The TFT of claim 34, wherein said one or more vacuum deposition processes comprise one or more of the following: sputtering, including RF sputtering; atomic layer deposition (ALD); and evaporation.

42. The TFT of claim 34, and further comprising post-processing at least a portion of said first portion of the dielectric layer, said second portion of the dielectric layer, said channel layer, said source and drain electrodes, and/or said gate electrode by use of at least one annealing process and/or ultraviolet (UV) curing process.

43. The TFT of claim 34, wherein said channel layer substantially comprises zinc indium oxide having a Zn:In atomic ratio approximately within the range of about 1:1 to about 1:8.

44. The TFT of claim 43, wherein said channel layer substantially comprises zinc indium oxide having a Zn:In atomic ratio approximately within the range of about 1:3 to about 1:5.

45. The TFT of claim 34, wherein said inorganic dielectric material comprises one or more of the following: $AlO_x$, $SiO_x$, $SiN_x$, $SiO_xN_y$, $ZrO_x$, $TaO_x$, $HfO_x$ and combinations thereof.

46. The TFT of claim 34, wherein said wherein said organic dielectric material comprises one or more of the following: UV curable monomers including UV curable acrylic monomers, acrylic polymers, thermal curable monomers, polymer solutions, melted polymer and/or oligomer solutions, poly methyl methacrylates, poly vinylphenols, benzocyclobutenes, one or more polyimides, and combinations thereof.

47. The TFT of claim 34, wherein said substrate comprises one or more of the following: plastics and/or one or more organic substrate materials, including polyimides (PI), polyethylene terephthalates (PET), polyethersulfones (PES), polyetherimides (PEI), polycarbonates (PC), polyethylenenaphthalates (PEN), acrylics including polymethylmethacrylates (PMMA), and combinations thereof, one or more inorganic materials, including silicon, silicon dioxide, one or more types of glass, stainless steel, metal foils, including foils of aluminum and copper, and combinations thereof.

* * * * *

UNITED STATES PATENT AND TRADEMARK OFFICE
CERTIFICATE OF CORRECTION

| | | |
|---|---|---|
| PATENT NO. | : 7,265,003 B2 | Page 1 of 1 |
| APPLICATION NO. | : 10/971336 | |
| DATED | : September 4, 2007 | |
| INVENTOR(S) | : Randy Hoffman et al. | |

It is certified that error appears in the above-identified patent and that said Letters Patent is hereby corrected as shown below:

In column 15, line 7, in Claim 17, delete "$SiN_k$" and insert -- $SiN_x$ --, therefor.

In column 15, line 9, in Claim 18, after "claim 1," delete "wherein said".

In column 15, line 43, in Claim 22, after "oxide" delete "." and insert -- ; --, therefor.

In column 16, line 32, in Claim 32, after "claim 22," delete "wherein said".

In column 16, line 38, in Claim 32, delete "benzocydobutenes" and insert -- benzocyclobutenes --, therefor.

In column 16, line 57, in Claim 34, after "oxide" delete "." and insert -- ; --, therefor.

In column 18, line 16, in Claim 46, after "claim 34," delete "wherein said".

Signed and Sealed this

Eleventh Day of November, 2008

JON W. DUDAS
*Director of the United States Patent and Trademark Office*